(12) United States Patent
Gratrix

(10) Patent No.: US 10,792,778 B2
(45) Date of Patent: Oct. 6, 2020

(54) METHOD FOR REMOVING CONTAMINATION FROM A CHUCK SURFACE

(71) Applicant: M Cubed Technologies, Inc., Newtown, CT (US)

(72) Inventor: Edward J. Gratrix, Monroe, CT (US)

(73) Assignee: M Cubed Technologies, Inc., Newtown, CT (US)

( * ) Notice: Subject to any disclaimer, the term of this patent is extended or adjusted under 35 U.S.C. 154(b) by 250 days.

(21) Appl. No.: 15/568,371

(22) PCT Filed: Aug. 9, 2016

(86) PCT No.: PCT/US2016/046216
§ 371 (c)(1),
(2) Date: Oct. 20, 2017

(87) PCT Pub. No.: WO2017/030841
PCT Pub. Date: Feb. 23, 2017

(65) Prior Publication Data
US 2018/0099371 A1    Apr. 12, 2018

Related U.S. Application Data

(60) Provisional application No. 62/205,349, filed on Aug. 14, 2015.

(51) Int. Cl.
*B24B 1/00*    (2006.01)
*B24B 37/07*   (2012.01)
(Continued)

(52) U.S. Cl.
CPC ............ *B24B 1/00* (2013.01); *B23Q 11/0042* (2013.01); *B24B 37/042* (2013.01); *B24B 37/07* (2013.01);
(Continued)

(58) Field of Classification Search
CPC ..... B23Q 11/0042; B24B 1/00; B24B 37/042; B24B 37/16; B24B 37/34; B24B 37/005; B24B 37/04; B24B 37/07; H01L 21/67092
See application file for complete search history.

(56) References Cited

U.S. PATENT DOCUMENTS 5,591,068 A * 1/1997 Taylor .................... B24B 13/00
                                                      451/104
5,740,580 A    4/1998 Leu
(Continued)

FOREIGN PATENT DOCUMENTS

DE       10085092 B4    8/2007
JP       H07/171747     7/1995
(Continued)

OTHER PUBLICATIONS

International Search Report dated Oct. 28, 2016 for International Application No. PCT/US2016/046216.
(Continued)

*Primary Examiner* — Eileen P Morgan
(74) *Attorney, Agent, or Firm* — Blank Rome LLP

(57) ABSTRACT

A method for decontaminating support surfaces of a wafer chuck, such as a wafer chuck, entails lightly passing a treatment tool having a nominally flat contacting surface over the regions of the chuck where contaminants are to be removed. The treatment tool and the chuck surface may have about the same hardness. The treatment tool may be minimally constrained so that it may conform to the surface being processed. When the treatment tool is contacted to a flat surface, the locust of contact may be in the form of a circle, ring or annulus. At higher application pressures, the treatment tool will abrade the chuck, which here is to be avoided, or at least minimized. Thus, the instant inventors have discovered that the same treatment tool that is used to (Continued)

engineer the elevation or profile of the surface, and its roughness, at lower application pressures can be used to remove grinding debris and other contaminants from the surface.

10 Claims, 4 Drawing Sheets

(51) Int. Cl.
*B24B 37/16* (2012.01)
*B24B 37/04* (2012.01)
*B23Q 11/00* (2006.01)
*B24B 37/34* (2012.01)
*H01L 21/67* (2006.01)

(52) U.S. Cl.
CPC .............. *B24B 37/16* (2013.01); *B24B 37/34* (2013.01); *H01L 21/67092* (2013.01)

(56) References Cited

U.S. PATENT DOCUMENTS

| | | | |
|---|---|---|---|
| 6,179,695 | B1 | 1/2001 | Takahashi et al. |
| 6,635,844 | B2 | 10/2003 | Yu |
| 6,638,144 | B2 * | 10/2003 | Sventek .................. B24B 1/00 451/36 |
| 6,682,406 | B2 | 1/2004 | Chiou |
| 9,669,653 | B2 * | 6/2017 | Parkhe .................. B44C 1/221 |
| 9,941,148 | B2 * | 4/2018 | Gratrix .................. G03F 7/707 |
| 2002/0036373 | A1 | 3/2002 | Kosakai |
| 2003/0200996 | A1 | 10/2003 | Hiatt et al. |
| 2005/0101232 | A1 * | 5/2005 | Meissner ................ B24B 13/01 451/278 |
| 2006/0079162 | A1 | 4/2006 | Yamashita et al. |
| 2006/0130767 | A1 | 6/2006 | Herchen |
| 2007/0049168 | A1 | 3/2007 | Fujita |
| 2008/0217291 | A1 * | 9/2008 | Higuma ............... C23C 16/4581 216/38 |
| 2009/0313776 | A1 * | 12/2009 | Mouri ............... H01L 21/67046 15/88.2 |
| 2010/0214549 | A1 | 8/2010 | Cadee et al. |
| 2014/0326278 | A1 * | 11/2014 | Kobayashi ............ B08B 7/0014 134/6 |
| 2016/0276203 | A1 | 9/2016 | Gratrix |
| 2016/0288291 | A1 * | 10/2016 | Kassir .................... B24B 37/30 |
| 2017/0291279 | A1 * | 10/2017 | Karandikar ............. B24B 53/12 |
| 2018/0154496 | A1 * | 6/2018 | Gratrix ................. B23B 31/021 |

FOREIGN PATENT DOCUMENTS

| | | |
|---|---|---|
| JP | H0936070 A | 2/1997 |
| JP | 2008/166616 | 7/2008 |
| JP | 2008300775 A | 12/2008 |
| JP | 2010/153407 | 7/2010 |
| JP | 2014103359 A | 6/2014 |
| JP | 2014128877 A | 7/2014 |
| WO | WO 2011/002881 | 1/2011 |
| WO | WO 2013/113568 | 8/2013 |
| WO | WO 2013/113569 | 8/2013 |

OTHER PUBLICATIONS

International Search Report dated Apr. 12, 2016 for International Application No. PCT/US2015/062231.
Marcin Golabczak, "Polishing of Hard Semiconductor Materials Made of Silicon Carbide", *Mechanics and Mechanical Engineering*, Technical University of Lodz, Lodz, Poland, vol. 15, No. 1, (2011).
Eric W. Weisstein, *CRC Concise Encyclopedia of Mathematics*, pp. 46 and 1184, CRC Press 1999.

* cited by examiner

METHOD FOR REMOVING CONTAMINATION FROM A CHUCK SURFACE

CROSS-REFERENCE TO RELATED APPLICATION(S)

This patent document claims the benefit of U.S. Provisional Patent Application No. 62/205,349, entitled "Method for removing contamination from a chuck surface", filed on Aug. 14, 2015 in the name of inventor Edward Gratrix. Where permitted, the entire contents of this provisional patent application are incorporated by reference herein.

STATEMENT REGARDING U.S. FEDERALLY SPONSORED RESEARCH

None.

TECHNICAL FIELD

This invention solves the problem for wafer handling tool cleaning and contamination removal in an in-situ manner, thus allowing a higher level of tool availability and lesser likelihood of cross contamination.

BACKGROUND ART

Semiconductor processes have inherent contamination in the forms of particulate and films which, although progress is continuously being made in reducing the level of particulate, is an omnipresent issue impacting device yield. Capital equipment feature tools and surfaces that serve for tens or hundreds of thousands of iterations; thus, the need for in-situ cleaning is critical. Contaminants can be particles, films or converted damage layers due to energetic bombardment (typical of plasma, ion, electron bombardment).

Often applied to clean these tools are mechanical and/or chemical processes that preferentially remove contaminants. Additionally, there are preventative measures to limit the impact of the contaminants during subsequent processes, such as scrubbers on the semiconductor wafer. One of the most challenging surfaces to decontaminate is the wafer chucking surface, which handles the wafers. These are the clamping tools that hold the wafers, and are exposed to rubbing and other friction processes that are the greatest contributors to particles being knocked off the wafer and/or the chuck.

Wafer handling tools, and pin chucks in particular, are extremely difficult to clean and decontaminate in-situ since they are not in chemical atmospheres where aqueous or dry chemical processes can be routinely used, but rather they operate in clean and dry conditions and are often swapped out or put on routine maintenance schedules.

A pin chuck consists of a rigid body with a plurality of pins on the surface on which the substrate to be processed (e.g., Si wafer) rests.

The use of pins on these devices is to provide minimum chuck-to-substrate contact. Minimum contact reduces contamination and enhances the ability to maintain high flatness. The pin tops need to have low wear in use to maximize life and precision. The pin tops also need to exhibit low friction so the substrate easily slides on and off, and lies flat on the pins. Furthermore, the pin tops should exhibit no metallic contamination.

The pins exist in many geometries, and go by many names including burls, mesas, bumps, proud lands, proud rings, etc.

The pin chuck by its very nature is a very low bearing area (<2% is typical); thus mechanical means such as foam, pad scrubbers or brushes are ineffective since the pins or mesa features will tear through the contact medium.

The instant invention addresses these issues, and provides a solution.

DISCLOSURE OF THE INVENTION

A method for decontaminating at least the support surfaces of a chuck, such as a wafer chuck, entails lightly passing a treatment tool having a contacting surface over the regions of the chuck where contaminants are to be removed. The treatment tool and the chuck surface may have about the same hardness. The treatment tool may be minimally constrained so that it may conform to the surface being processed. When the treatment tool is contacted to a flat surface, the area of contact may be in the form of a circle, ring or annulus. At higher application pressures, the treatment tool will abrade the chuck, which here is to be avoided, or at least minimized. Thus, the instant inventors have discovered that the same treatment tool that is used to engineer the elevation or profile of the surface, and its roughness, at lower application pressures can be used to remove grinding debris and other contaminants from the surface.

The contacting or treatment surface of the treatment tool may be nominally, or appear visually, flat, but may in reality feature turn-up edges such that the treatment surface assumes a slight toroidal shape.

MODES FOR CARRYING OUT THE INVENTION

In accordance with the instant invention, a method for decontaminating at least the support surfaces of a chuck such as a wafer chuck, entails lightly passing a treatment tool having a flat contacting surface over the regions of the chuck where contaminants are to be removed. The chuck support surface may feature pins or mesas. Other areas of the chuck may contain recesses. The flat surface of the treatment tool that contacts the chuck may be in the form of a ring or annulus, or preferably a toroid. The treatment tool may be attached to, or supported by a fixture, and the attachment or support may be one of minimal constraint, such as a ball-and-socket joint. The treatment tool may have a similar hardness to that of the chuck, or at least of the surfaces to be processed (decontaminated). The contact pressure that the treatment tool makes with the chuck is maintained at a level below that pressure that would significantly alter the elevation or roughness of the chuck material during the decontamination process. The size, effective diameter, or cross-section of the treatment tool is less than the diameter of the chuck. This treatment tool size can be made quite small, in which case the treatment tool can process recessed areas on the chuck, such as the area for the vacuum seal, or for the areas between wafer support pins.

EXAMPLES

The invention will now be further described with reference to the following Examples.

Example 1: Cleaning Versus Profiling

This example demonstrates the difference between the use of the treatment tool of the instant invention in a cleaning mode versus a profiling mode. This example is made with reference to FIGS. 1 and 2.

Figure 1:
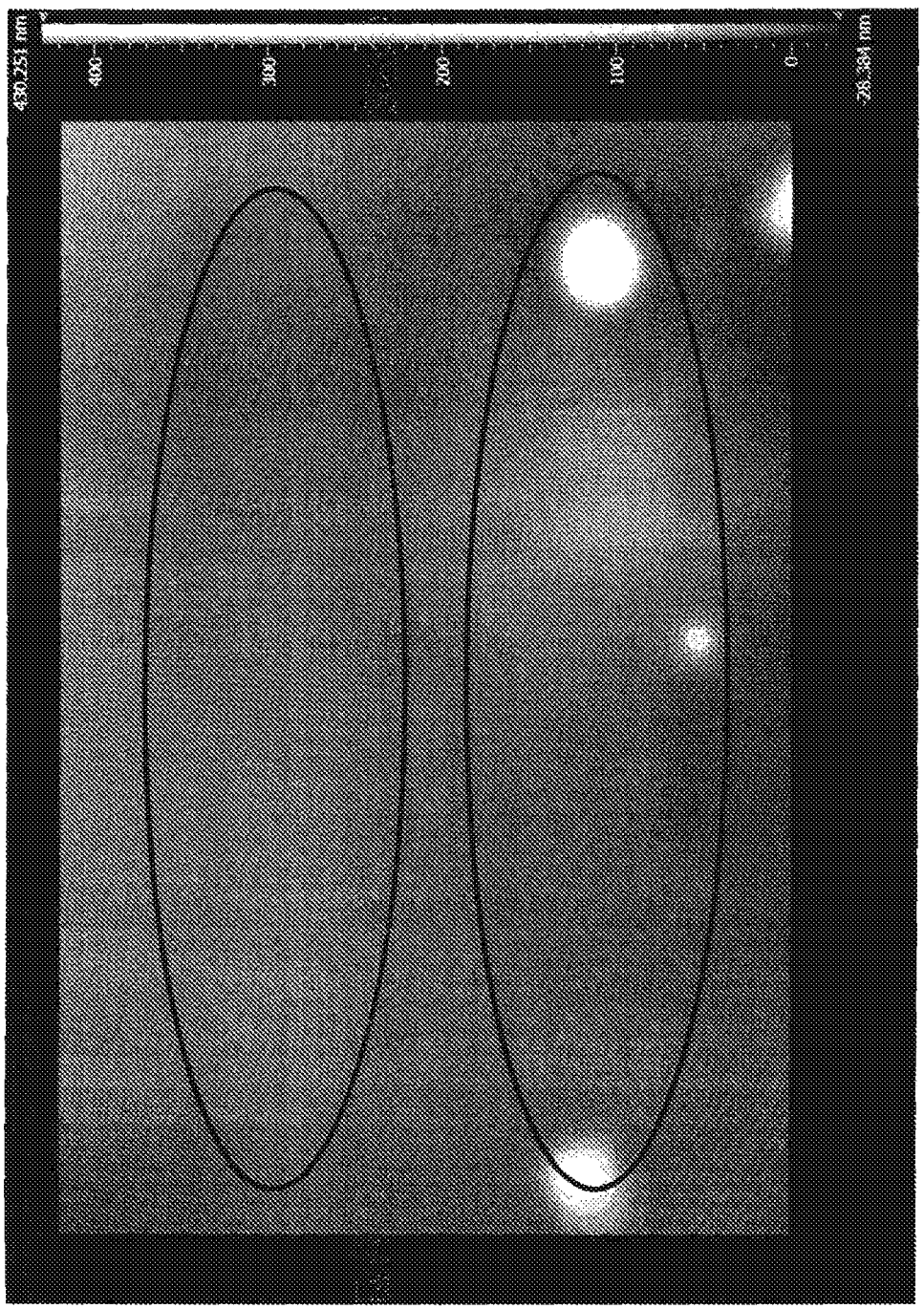
FIG. 1 is an interferometer map of a region on the surface of an optically flat substrate, such as a silicon wafer, that is clamped to a pin chuck. The lower circled area is before cleaning, and the upper circled area is after cleaning.

FIG. 1 is an interferometer "map" showing the effect on surface elevation of a treatment tool in "cleaning" mode. Both the treatment tool and the surface being processed have about the same hardness and each is fabricated from reaction bonded SiC (RBSC). The surface being processed is a pin chuck, which is resolved by clamping an optically flat wafer on the pin chuck and imaging in an interferometer. The scale on the right of the map shows elevation change by changes in brightness.

The lower oval-shaped area in FIG. 1 is before cleaning, and the upper oval-shaped area is after cleaning. Contamination on the pin chuck and under the wafer is seen as white high points. The debris is stuck on the pin tops under the wafer on seen in the lower oval area, which was not cleaned. The upper oval area shows where the pin chuck was cleaned after 100 cycles of treatment by a tool in physical contact with the substrate.

The absence of the white spots in the upper oval-shaped area indicates that the cleaning operation removed this debris. However, the fact that the area inside the oval regions has about the same shade of gray as areas outside indicates that the cleaning treatment did not change the elevation of the pin tops; it did not remove pin material.

The treatment tool is 27 mm in diameter. By outward appearance, it is a disc having a flat contacting surface, but in reality it has a slight toroidal shape so that when it is brought into contact with a flat surface, the locus of contact is not that of a disc but instead is a circle. (The modification to form the toroidal shape is very slight, and may involve deviations from "flat" that are less than a micron.) A dead weight loading of 37 grams is applied to the treatment tool. The tool is moved across the surface to be treated at a velocity of 30 mm/sec. Every point on the surface treated was processed by the tool 100 times (100 cycles of cleaning).

Figure 2:
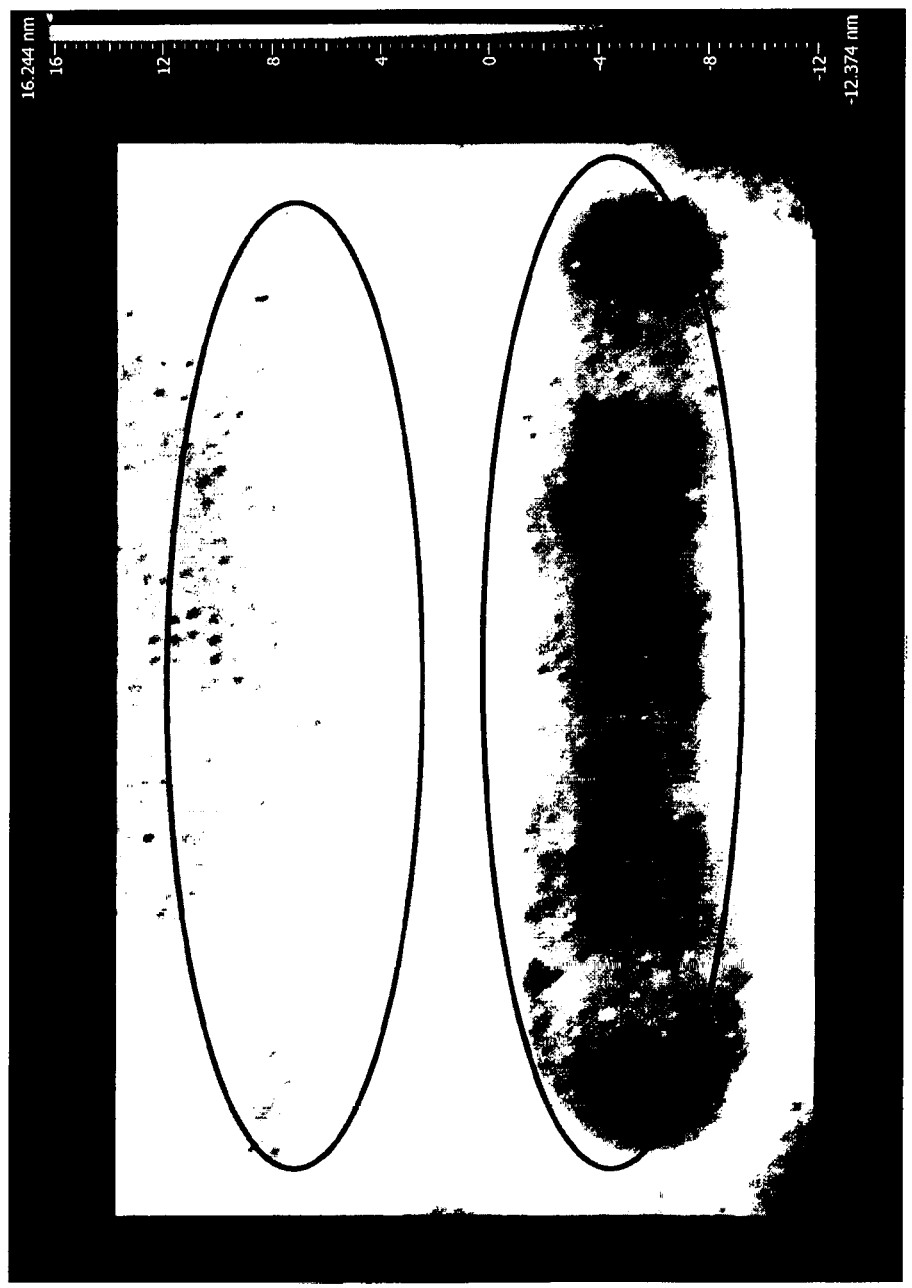
FIG. 2 is an interferometer map of a region on the surface of an optically flat substrate, such as a silicon wafer, that is clamped to a pin chuck. The area in the upper oval was treated with a 37-gram-loaded tool, and the area in the lower oval region was treated with a 187-gram-loaded tool.

Now compare this FIG. 1 with FIG. 2. FIG. 2 is an interferometer map of a region on the surface of an optically flat substrate, such as a silicon wafer, that is clamped to a pin chuck. The top section (area in the upper oval) was treated with 100 cycles of a 37 gram tool showing no measurable change while the lower section (area in the lower oval) was given 100 cycles of treatment by a 187-gram-loaded tool in physical contact with the substrate. The area inside the upper oval region has about the same shade of gray as areas outside, again indicating that the cleaning treatment did not change the elevation of the pin tops. In distinct contrast, the area inside the lower oval region is much darker than the area outside the lower oval region, as well as darker than the area inside the upper oval region, indicating a change in elevation, namely, a reduction in elevation. This indicates that the treatment tool operated under these conditions was digging into and removing material from the wafer chuck.

Thus, this example demonstrates that a certain threshold pressure must be reached before the treatment tool of about the same hardness as the surface being treated will remove material from that surface. It also shows that a treatment tool that is used for profiling (change of surface elevation by removing material of the work piece) can be used for cleaning of debris without removing work piece material, and that such may be accomplished by reducing the applied loading (dead weight) on the treatment tool.

Example 2: Cleaning a Wafer Chuck Surface

This Example demonstrates how the treatment tool of the instant invention may be used in "cleaning" mode to remove debris from the surface of a wafer chuck, and is made with reference to FIGS. 3 and 4.

Figure 3A:
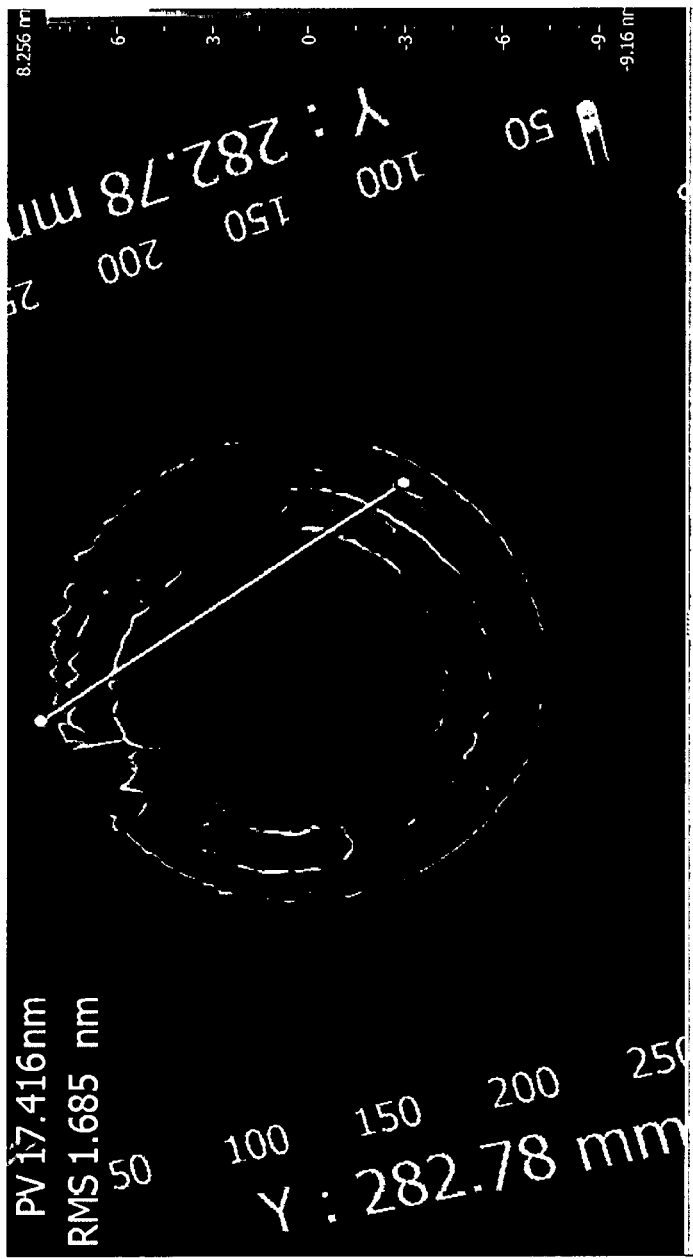
FIGS. 3A and 4A show an interferometer map of the surface elevation of a wafer chuck before and after a debris removal treatment, respectively, with a treatment tool in physical contact with the chuck surface.
Figure 3B:
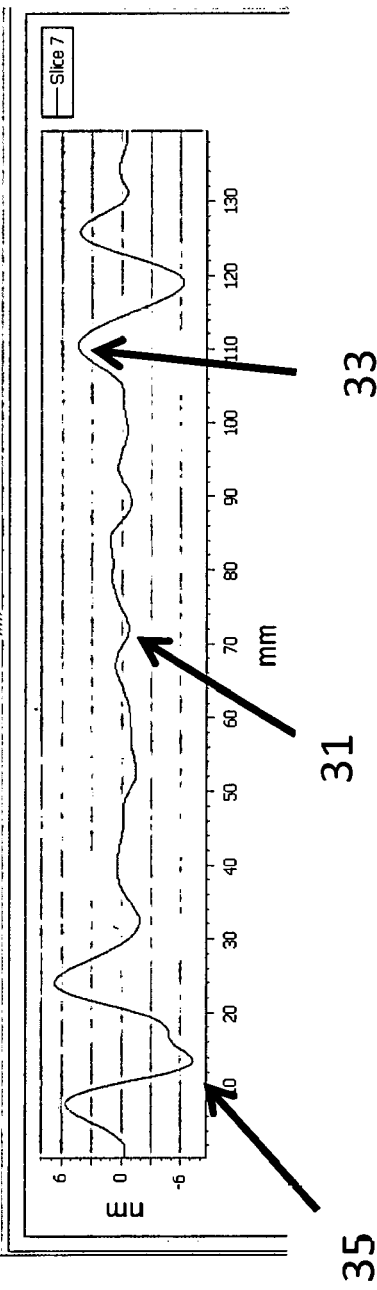
FIGS. 3B and 4B show a trace of surface elevation along the chords indicated in FIGS. 3A and 4A.

FIG. 3A shows an interferometer map showing a highly magnified surface topography of an essentially optically flat wafer clamped to a wafer chuck. The wafer chuck features a shallow circular groove machined into this top surface near the periphery of the image. The white chord in this FIG. 3A indicates the scan of the surface elevation measuring device that gives rise to the surface elevation plot in FIG. 3B. This particular wafer chuck has been in testing for wear properties whereby the groove was generated that is typical of the wear of a pin chick during normal use. The result is that some debris remains in the region of the worn groove, thus contaminating the wafer chuck. Arrow 31 shows the surface elevation of the wafer chuck surface in the middle of the chord, away from the machined groove. Arrow 33 shows the lower elevation of the machined groove. Arrow 35 shows one of a pair of peaks or "humps" adjacent and on opposite sides of the machined groove. These peaks correspond to debris, and suggest that debris preferentially accumulates adjacent the groove.

Figure 4A:
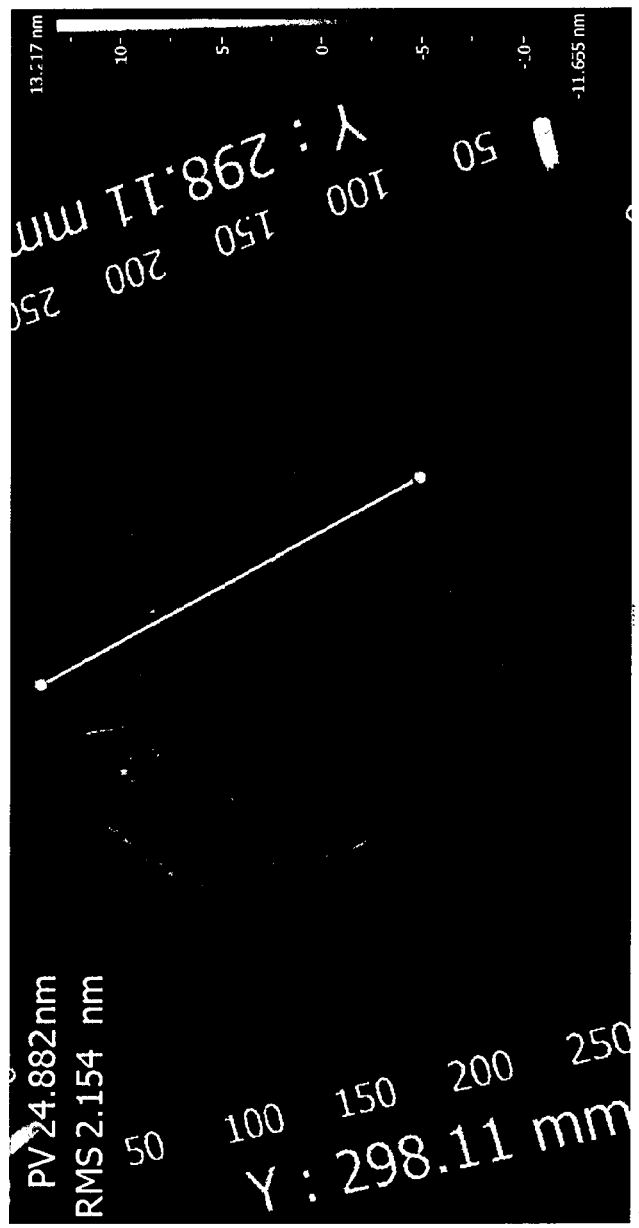
Figure 4B:
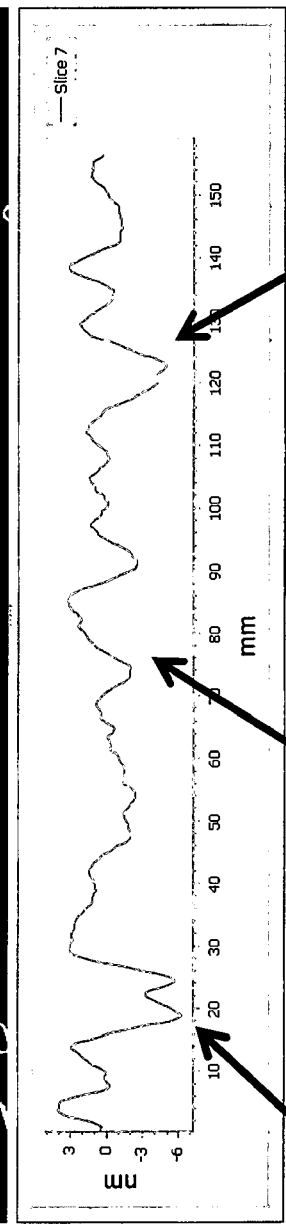

The wafer chuck support surface was then treated with the treatment tool in "cleaning mode", that is, under conditions similar to that described for cleaning in Example 1. FIGS. 4A and 4B show the resulting interferometer map and elevation trace along a similar chord following this cleaning treatment. Arrow 41 shows the surface elevation of the wafer chuck surface in the middle of the chord, away from the machined groove. Arrow 43 shows the lower elevation of the machined groove. Arrow 45 points to the elevation just outside of the circular groove. The peaks or humps have been noticeably reduced, and are not much higher than the balance of the wafer chuck surface, suggesting that the debris has been removed to a large extent from the regions just inside and outside the machined groove.

Thus, this example shows that the treatment tool can be used to remove debris from the surface of a wafer chuck, and without modifying the profile of the chuck through removal of chuck material.

INDUSTRIAL APPLICABILITY

Although much of the forgoing discussion has focused on articles and devices for chucking semiconductor wafers, one of ordinary skill in the art will recognize other related applications where the techniques and articles disclosed in the instant patent application will be useful, for example, in other areas or industries where a surface has to be finished to a desired shape or degree of flatness, and/or having a certain degree of texture (roughness/smoothness).

According to an embodiment of the instant invention, what is proposed is to remove contaminate(s) from the surface by hard mechanical contact with a material that is more or less the same hardness as the wafer handling tool. The purpose of the similar hardness is to minimize the particulate generation by wear of a soft tool or wear of the wafer handing chuck by a harder material.

Additionally, since there are wafer handing tools that have stringent control of flatness and to pins or mesas this tool is proposed to be ring or annular or toroidal shape such that it conforms to the natural surface flatness and may be moved over the surface in a manner that does not damage the flatness.

An unique property is to control the weight such that the two materials are not just run together but lightly travel with a minimal amount of pressure. By that is meant sufficient applied pressure to remove contaminate(s) or debris but not enough applied pressure to significantly alter the flatness or roughness of the chuck.

An artisan of ordinary skill will appreciate that various modifications may be made to the invention herein described without departing from the scope or spirit of the invention as defined in the appended claims.

What is claimed is:

1. A method for removing contamination from a the support surface of a chuck, comprising:
   (a) providing a treatment tool having a treatment surface configured to contact and pass lightly over said support surface, said treatment surface having a slight toroidal shape;
   (b) moving said treatment tool over at least a portion of said support surface containing contamination, wherein at least during said moving, the force applied by said treatment tool against said support surface is maintained at a level of pressure sufficiently low such that said treatment surface does as to not abrade said support surface; and
   (c) continuing said moving for a time or a number of passes over the contaminated surface sufficient to remove said contamination, and (d) wherein a diameter of said support surface is greater than a the size of said treatment surface.

2. The method of claim 1, wherein said treatment tool is minimally constrained, thereby permitting said treatment surface to conform to the support surface of said wafer chuck.

3. The method of claim 1, wherein said surface of said treatment tool is shaped as a toroid.

4. The method of claim 1, wherein said treatment tool comprises reaction bonded SiC.

5. The method of claim 1, wherein said surface of said treatment tool and said support surface of said chuck have about the same hardness.

6. The method of claim 1, wherein said treatment tool has a small cross-section, thereby enabling said treatment tool to process areas on said chuck that are recessed relative to said support surface of said chuck.

7. A method for removing contamination from a the support surface of a chuck, comprising:
   (a) providing a treatment tool having a surface configured to make contact with, and pass over, said support surface, said treatment tool surface shaped such that minimally constrained contact of said treatment tool surface to a flat surface, is in the form of a circle;
   (b) moving said treatment tool surface over at least a portion of said chuck support surface containing contamination, wherein at least during said moving, the force applied by said treatment tool surface against said support surface is maintained at a level of pressure sufficiently low such that said treatment tool surface does not damage a flatness of said chuck support surface;
   (c) continuing said moving for a time or a number of passes over the contaminated surface sufficient to remove said contamination, (d) wherein a diameter of said support surface is greater than a size of said treatment tool surface; and
   (e) further wherein said treatment tool surface and said support surface of said chuck have about the same hardness.

8. The method of claim 7, wherein said treatment tool is held in such a manner that the pressure applied minimizes erosion of said chuck and tool.

9. A method for removing contamination from a the support surface of a chuck, comprising:
   (a) providing a treatment tool having a surface configured to contact and pass over said support surface, said treatment tool surface configured such that a conforming contact of said treatment tool surface and a flat surface is a circle;
   (b) moving said treatment tool over at least a portion of said support surface containing contamination, wherein at least during said moving, the force applied by said treatment tool against said support surface is maintained at a level of pressure sufficiently low so as to not alter a flatness or roughness of said support surface;
   (c) continuing said moving for a time or a number of passes over the contaminated surface sufficient to remove said contamination, (d) wherein a diameter of said support surface is greater than a size of said treatment tool surface; and
   (e) further wherein said treatment tool has a hardness that is at least as high as that of said support surface, thereby avoiding changing a texture of said support surface .

10. The method of claim 9, wherein said treatment tool comprises SiC.

* * * * *